United States Patent
Gross et al.

(10) Patent No.: US 7,120,033 B2
(45) Date of Patent: Oct. 10, 2006

(54) ELECTRICALLY CONDUCTING BONDING CONNECTION

(75) Inventors: Kurt Gross, Laaber (DE); Hans Rappl, Nittendorf (DE)

(73) Assignee: Siemens Aktiengesellschaft, Munich (DE)

( * ) Notice: Subject to any disclaimer, the term of this patent is extended or adjusted under 35 U.S.C. 154(b) by 388 days.

(21) Appl. No.: 10/196,027

(22) Filed: Jul. 16, 2002

(65) Prior Publication Data

US 2003/0019664 A1 Jan. 30, 2003

(30) Foreign Application Priority Data

Jul. 26, 2001 (DE) ................. 101 36 514

(51) Int. Cl.
*H05K 7/10* (2006.01)
(52) U.S. Cl. ............... 361/808; 361/779; 361/777; 361/729
(58) Field of Classification Search ............ 361/808, 361/777, 729, 809, 779, 793, 775, 760; 257/777, 257/684, 678, 687; 438/118, 122; 439/83, 439/751
See application file for complete search history.

(56) References Cited

U.S. PATENT DOCUMENTS

| | | | | |
|---|---|---|---|---|
| 4,371,231 A | | 2/1983 | Jung | |
| 4,381,134 A | * | 4/1983 | Anselmo et al. | 439/444 |
| 4,525,246 A | * | 6/1985 | Needham | 205/125 |
| 6,179,631 B1 | * | 1/2001 | Downes et al. | 439/83 |
| 6,231,402 B1 | * | 5/2001 | Kikuchi | 439/751 |
| 6,521,485 B1 | * | 2/2003 | Su et al. | 438/114 |
| 6,537,857 B1 | * | 3/2003 | Aquien et al. | 438/122 |
| 6,538,308 B1 | * | 3/2003 | Nakase et al. | 257/675 |
| 6,559,529 B1 | * | 5/2003 | Torti et al. | 257/684 |
| 6,593,535 B1 | * | 7/2003 | Gailus | 174/262 |

FOREIGN PATENT DOCUMENTS

| | | |
|---|---|---|
| DE | 29 45 670 B1 | 5/1981 |
| DE | 198 31 876 A1 | 2/1999 |
| JP | 7-58251 * | 3/1995 |

* cited by examiner

*Primary Examiner*—Kamand Cuneo
*Assistant Examiner*—Hung S. Bui
(74) *Attorney, Agent, or Firm*—Baker Botts L.L.P.

(57) ABSTRACT

An electrically conducting bonding connection (B) is produced between an electronic circuit (S) arranged on an electrically conducting support plate (1) and the support plate (1) by providing a hole (4, 5), into which an electrically conducting bonding element (2) with a bondable surface (3) is pressed in such a way that the support plate (1) and the bonding element (2) enter into an electrically conducting and frictional connection; the bonding connection is subsequently produced with the bonding element (2).

11 Claims, 1 Drawing Sheet

ELECTRICALLY CONDUCTING BONDING CONNECTION

CROSS REFERENCE TO RELATED APPLICATION

This application claims priority to German Application No. 101 36 514.4 filed Jul. 26, 2001.

BACKGROUND OF THE INVENTION

The invention relates to an electrically conducting bonding connection between an electronic circuit arranged on an electrically conducting support plate and the support plate.

To ensure better stability or better heat removal, electronic circuits are often arranged on metallic, electrically conducting support plates.

From the electronic circuit, built up for example on a printed circuit board or ceramic board, electrically conducting connections, for example ground connections, to the metallic, electrically conducting support plate must be produced. Since support plates are generally produced from aluminum in a casting process, they are coated with an electrically poorly conducting casting skin.

Until now, electrically conducting connections between the electric circuit and the support plate have been produced by means of bonding connections or by drilling threads into the support plate and attaching cables and cable lugs on it by means of screws.

Bonding connections are in this case usually produced by means of thick aluminum wire. In this case, the surface of the support plate (for example elevations created in the course of the casting process) must be prepared by machining shortly before the bonding operation, with the electronic circuit already mounted, for example by milling, since a bonding connection between aluminum wire and a casting skin is not possible because it represents a connection which is mechanically and electrically very poor.

Such a connection is very complex to produce, requires considerable space and entails the risk of soiling (metal scobs caused by the milling work). A connection of this type cannot be produced by automatic machines alone. Further, manual processing steps are required.

SUMMARY OF THE INVENTION

The invention is based on the object of producing an electrically conducting connection between an electronic circuit and an electrically conducting support plate with much lower space requirement and lower costs by automatic machines alone, without further human action.

This object is achieved according to the invention by an electrically conducting bonding connection between an electronic circuit arranged on an electrically conducting support plate and the support plate, comprising a hole at the point of the support plate at which a bonding connection is to be produced, an electrically conducting bonding element with a bondable surface being pressed into the hole, wherein the support plate and the bonding element enter into an electrically conducting and frictional connection, and whereby subsequently the bonding connection is produced.

A method for manufacturing an electrically conducting bonding connection between an electronic circuit arranged on an electrically conducting support plate and the support plate, comprises the steps of:
providing a hole at the point of the support plat at which a bonding connection is to be produced,
pressing an electrically conducting bonding element with a bondable surface into said hole, whereby the support plate and the bonding element enter into an electrically conducting and frictional connection, and whereby subsequently the bonding connection is produced.

Another embodiment of the present invention is a heat sink comprising an electrically conducting bonding connection between an electronic circuit arranged on said heat sink wherein the heat sink is an electrically conducting support plate, a hole at the point of the support plate at which a bonding connection is to be produced, and an electrically conducting bonding element with a bondable surface being pressed into the hole, wherein the support plate and the bonding element enter into an electrically conducting and frictional connection, and whereby subsequently the bonding connection is produced.

This envisages providing holes or blind holes at the points of the support plate at which a bonding connection is to be produced, said holes being cast already in the course of the casting operation or subsequently drilled by automatic machines, and metallic bonding elements which have good electrical conduction and bond well are then pressed into said holes by means of an automatic machine and enter into a nonpositive connection with the support plate. The advantage of drilling is that an electronic circuit has not been mounted at this stage and the support plate can be cleaned and freed of drilling scobs before mounting the electronic circuit.

One particular advantage of the invention is that the material composition and bonding surface of the bonding elements can be freely chosen and can consequently be optimized for the connection to the support plate and for the bonding process. For example, the bonding elements may consist of cold-rolled aluminum or of nickel or have a nickel-plated or gold-plated bonding surface.

BRIEF DESCRIPTION OF THE DRAWINGS

An exemplary embodiment according to the invention is described in more detail below on the basis of a drawing, in which.

DETAILED DESCRIPTION OF THE PREFERRED EMBODIMENTS

Figure 1:
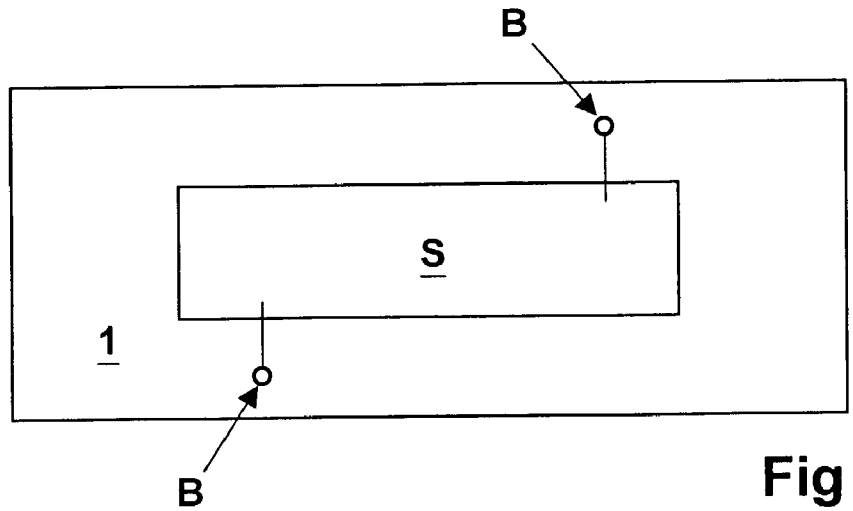
FIG. 1 shows a plan view of a support plate with an electronic circuit mounted on it.

FIG. 1 shows a plan view of a support plate 1, on which there is mounted an electronic circuit S, which itself may be arranged for example on a printed circuit board. The electronic circuit S is connected to the support plate by means of two bonding connections B (ground connections).

Figure 2:
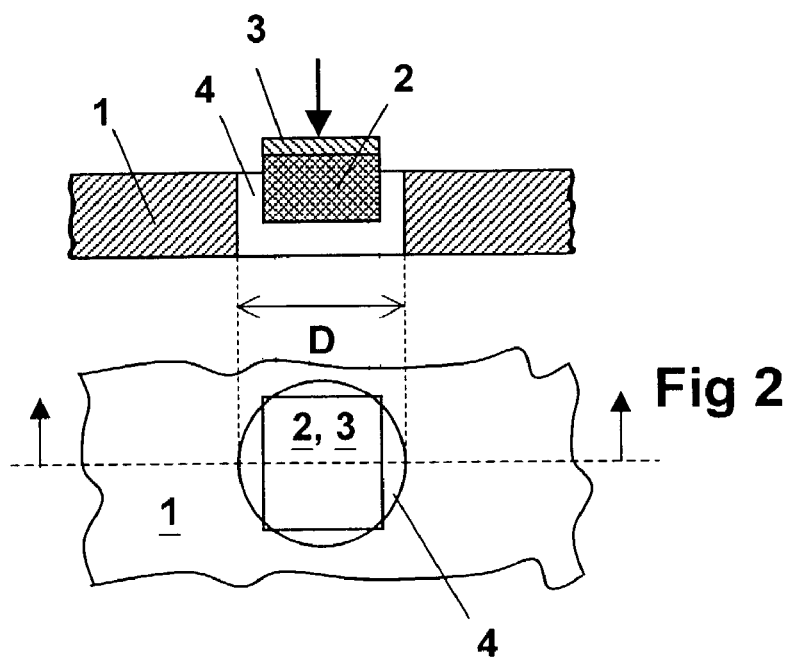
FIG. 2 shows a plan view and section of a bonding connection.

FIG. 2 shows in cross section and in a plan view a support plate 1 with a through-hole 4, into which a bonding element 2, which is square in plan view and is for example made of aluminum or has a gold-plated bonding surface 3, is pressed.

The bonding element may also be formed as a regular hexagon or octagon in plan view. However, especially if it is created in the course of the casting process, it is also possible for the hole to be a regular rectangle, hexagon or octagon in cross section and the bonding element to be round.

Figure 3:
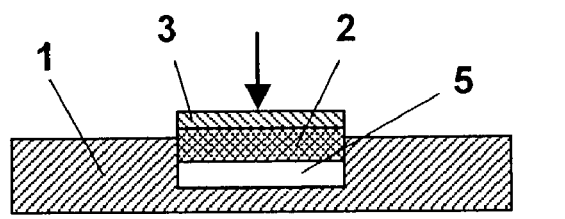
FIG. 3 shows a section through a bonding connection with a blind hole.

FIG. 3 shows a support plate 1 in cross section, similar to FIG. 2 but with the difference that the bonding element 2 is now pressed into a blind hole 5 instead of into a through-hole 4.

To produce the bonding connections, the support plate 1 is passed along an automatic production line. If it has no holes 4, 5 prepared during the casting operation, they are drilled in a first automatic station and the support plate is subsequently automatically cleaned (otherwise it is possible to dispense with these operations). Subsequently, the bonding elements 2 are automatically pressed into the holes 4 or 5 provided and the electronic circuit S is mounted. The bonding connections can subsequently be produced by an automatic bonding machine.

All the operations mentioned can be carried out automatically, without intermediate manual steps.

The invention claimed is:

1. A heat sink comprising:
    an electrically conducting bonding connection between an electronic circuit, arranged on said heat sink, and an electrically conducting support plate, the plate acting as a heat sink,
    the support plate having a hole, the hole formed at the point of the support plate at which the bonding connection is to be produced,
    an electrically conducting bonding element with a bondable surface being pressed into said hole, wherein the support plate and the bonding element enter into an electrically conducting and frictional connection, and whereby subsequently the bonding connection is produced.

2. A heat sink as claimed in claim 1, wherein the hole is a cast hole that is made during the casting operation of the support plate.

3. A heat sink as claimed in claim 1, wherein the hole is drilled into the support plate and wherein the support plate is subsequently cleaned.

4. A heat sink as claimed in claim 1, wherein the hole is a blind hole.

5. A heat sink according to claim 1, wherein the hole is formed as a rectangle, hexagon or octagon in plan view and the bonding element is round.

6. A heat sink according to claim 1, wherein the bonding element is formed as a rectangle, hexagon or octagon in plan view.

7. A heat sink according to claim 1, wherein the hole is formed as a rectangle, hexagon or octagon in plan view.

8. A heat sink according to claim 1, wherein the bonding element consists of aluminum.

9. A heat sink according to claim 1, wherein the bonding element consists of nickel.

10. A heat sink according to claim 1, wherein the bonding element has a nickel-plated bonding surface.

11. A heat sink according to claim 1, wherein the bonding element has a gold-plated bonding surface.

* * * * *